（12) United States Patent
Koren et al.

(10) Patent No.: US 8,594,232 B2
(45) Date of Patent: *Nov. 26, 2013

(54) SYSTEM FOR PREDISTORTION AND POST-DISTORTION CORRECTION OF BOTH A RECEIVER AND TRANSMITTER DURING CALIBRATION

(75) Inventors: Doron Koren, Jacksonville, FL (US); Sergey Toujikov, Bat Yam (IL)

(73) Assignee: Vyycore Corporation, Santa Clara, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 13/358,974

(22) Filed: Jan. 26, 2012

(65) Prior Publication Data
US 2012/0120990 A1 May 17, 2012

Related U.S. Application Data

(63) Continuation-in-part of application No. 12/143,771, filed on Jun. 21, 2008, now Pat. No. 8,126,036.

(51) Int. Cl.
*H04L 25/49* (2006.01)
(52) U.S. Cl.
USPC ........... 375/297; 375/295; 375/296; 375/316; 375/285; 375/345; 375/346; 375/219
(58) Field of Classification Search
USPC .......... 375/295, 296, 297, 316, 285, 345, 346
See application file for complete search history.

(56) References Cited

U.S. PATENT DOCUMENTS

| 4,329,655 A | 5/1982 | Nojima et al. | |
|---|---|---|---|
| 6,670,900 B1 | 12/2003 | Zhang | |
| 7,091,779 B2 | 8/2006 | Sahlman | |
| 7,215,716 B1 | 5/2007 | Smith | |
| 7,242,725 B2 | 7/2007 | Matsumoto et al. | |
| 7,289,575 B1 | 10/2007 | Kenington | |
| 7,333,423 B2 | 2/2008 | Palaskas et al. | |
| 7,333,561 B2 * | 2/2008 | Pinckley et al. | 375/297 |
| 7,460,613 B2 * | 12/2008 | Sahlman | 375/296 |
| 7,463,866 B1 * | 12/2008 | Chen | 455/91 |
| 7,653,362 B2 | 1/2010 | Ahmed | |
| 7,715,836 B2 * | 5/2010 | Vassiliou et al. | 455/423 |
| 7,856,048 B1 * | 12/2010 | Smaini et al. | 375/221 |
| 8,126,036 B2 * | 2/2012 | Koren et al. | 375/219 |
| 2003/0016741 A1 | 1/2003 | Sasson et al. | |
| 2003/0117217 A1 | 6/2003 | Matsuyoshi | |
| 2004/0257157 A1 | 12/2004 | Sahlman | |
| 2005/0148304 A1 | 7/2005 | Jerng | |
| 2005/0242876 A1 | 11/2005 | Obernosterer | |
| 2005/0281345 A1 | 12/2005 | Obernosterer et al. | |
| 2009/0088086 A1 | 4/2009 | Vassiliou et al. | |
| 2009/0232191 A1 | 9/2009 | Gupta et al. | |
| 2010/0039174 A1 | 2/2010 | Teetzel | |

* cited by examiner

*Primary Examiner* — Siu Lee
(74) *Attorney, Agent, or Firm* — Mark Young, P.A.

(57) ABSTRACT

A post-distorter compensates for receiver nonlinearity in calibration mode. Linearized receiver-side output from the post-distorter is used to correctly compensate for transmitter-side nonlinearities in calibration mode. The post-distorter also compensates for receiver-side nonlinearities during normal receive mode. Thus, the post-distorter features dual modes of use, a calibration mode, wherein calibration signals received from the adjacent transmitter are linearized by the post-distorter and a normal receive mode, wherein communication signals from a remote transmitter are linearized by the post-distorter.

14 Claims, 2 Drawing Sheets

SYSTEM FOR PREDISTORTION AND POST-DISTORTION CORRECTION OF BOTH A RECEIVER AND TRANSMITTER DURING CALIBRATION

RELATED APPLICATIONS

This application is a continuation-in-part and claims the benefit of priority of U.S. Nonprovisional application Ser. No. 12/143,771 filed 21 Jun. 2008, the entire contents of which are incorporated herein by this reference and made a part hereof.

FIELD OF THE INVENTION

The present invention relates generally to high-performance wireless communications applications, and, more specifically, to compensation for RF receiver and transmitter nonlinearities using predistortion and post-distortion in a calibration mode.

BACKGROUND

Despite considerable advances in wireless transceiver technology, receiver and transmitter nonlinearity continues to limit the performance of wireless systems and devices. In the design of radio receivers, nonlinearity restricts the ability of a radio to receive weak signals in the presence of nearby stronger signals. In radio transmitters, nonlinearity can cause the transmitted signal to spill over into adjacent frequency channels, interfering with other users.

Modern mobile communication systems use Orthogonal Frequency-Division Multiplexing (OFDM) schemes to transmit multiple channels, closely spaced over an assigned frequency band. OFDM is a frequency-division multiplexing (FDM) scheme utilized as a digital multi-carrier modulation method. A large number of closely-spaced orthogonal sub-carriers are used to carry data. The data are divided into several parallel data streams or channels, one for each sub-carrier. Each sub-carrier is modulated with a conventional modulation scheme, such as quadrature amplitude modulation or phase shift keying.

An OFDM signal exhibits a high peak-to-average power ratio (PAPR) because the independent phases of the sub-carriers often combine constructively. Handling the high PAPR requires a high-resolution digital-to-analog converter (DAC) in the transmitter, a high-resolution analog-to-digital converter (ADC) in the receiver, and a linear signal chain.

The linearity requirement is problematic because amplifiers used in RF circuits are inherently non-linear in order to minimize power consumption. Nonlinearity in the signal chain causes signal compression and as a result introduces distortion and intermodulation distortion. Nonlinearities are more pronounced at higher power levels, with the rate of errors in a wireless channel being related to average power, among other variables. An amplifier maintains a constant gain for low-level input signals. However, at higher input levels, the amplifier goes into saturation and its gain decreases. A 1 dB compression point ($G_{1dB}$) indicates a power level that causes the gain to drop by 1 dB from its small signal value. To reduce the signal compression, the operating point of the amplifier can be set far from the compression point which in turn causes low power efficiency.

As is well known, a major source of non-linearity is distortion and spectral regrowth, which occur due to non-linear amplitude and phase response of the amplifier, particularly as power nears the saturation level. Third-order distortion non-linearities typically cause the strongest intermodulation products.

Most emerging OFDM and WCDMA standards produce high peak-to-average ratio signals. In the past, when most applications produced a low peak-to-average ratio signals, nonlinearities at high power levels did not have important effect. However, as required peak-to-average ratio increases, intermodulation and spectral regrowth created by the RF front end (mainly by the power amplifier) become unavoidable.

To linearize amplifier output, compensation methodologies have been devised. One compensation method is predistortion, which entails inserting a nonlinearity (i.e., non-linear amplitude and phase characteristics complementary to the distortion) prior to a radio frequency power amplifier (PA) such that the combined transfer characteristic is linearized, as disclosed in U.S. Pat. Nos. 5,236,837 and 6,240,278. Ideally, the predistorter cancels distortion in the amplifier output over the entire signal bandwidth.

Post-distorters have also been used, mainly to reduce the calculation complexity of a predistorter. By way of example, US Patent Publication No. 2004/0032297 to Nygren discloses a post-distorter adapted to calculate system identification coefficients, and then substitute the calculated coefficients in a predistorter positioned before the power amplifier. Another known use for post-distortion is to simply decrease the bit error rate (BER) by correcting the transmitter power amplifier at the receiver chain, as disclosed in US Patent Publication No. 2004/0196921 to Matsumoto.

When a high peek to average ratio (PAR) signal is transmitted via power amplifier, the transitory temperature rises very quickly as the peek is reached. For a brief period of time (e.g., a couple of microseconds) the transistor temperature increases significantly. For example, if the peak to average ratio of a signal is 6 dB, the heat generated by the transistor may be 4 times higher the average. This phenomena causes the power amplifier to operate at a different power curve than normal. This is referred to as a "memory" effect, because the histogram of the power amplifier is related to the characteristic history of the signal being transmitted. The thermal resistance and capacitance of Silicon is a key factor in the memory effect. Additionally, for an RF-amplifier using a high PAR signal, the 3rd-order intermodulation distortion caused by the CMOS thermal memory effect is severe.

Various schemes have been proposed for digital-domain predistortion of RF power amplifier input signals. For example, U.S. Pat. No. 6,141,390, describes a system that uses a straight inverse modeling scheme with orthogonal predictor variables to determine the inverse of the distortion caused by a power amplifier of a RF transmitter. The predistorter determines complex predistorter coefficients based on the inverse modeling scheme, and stores the coefficients in a look-up table (LUT). The coefficients from the LUT are then used as the tap weights of a non-linear digital filter implementing the predistorter.

Other digital predistortion systems as described in U.S. Pat. Nos. 6,549,067 and 6,580,320, sample input to a non-linear amplifier and multiplies the input by itself using mixers in order to generate various orders of distortion. Filters/time-delay means are incorporated into the paths that generate the orders of distortion in order to produce phase and/or amplitude variation with frequency. The distortion orders are summed to provide the predistortion. The filter/time delay means can be implemented by adaptive filters in digital signal processing (DSP) circuits, which sample the output of the amplifier being linearized in order to obtain feedback for adapting the filter(s). The in-phase and quadrature parts of the input are separately digitally predistorted.

Most predisorter systems have two modes. During a calibration mode, the predistorter mechanism calculates system identification coefficients. During a data transmit mode (normal transmit mode using the calculated coefficients) the calculated coefficients are applied to negate nonlinearities. These prior art approaches erroneously assume that the receiver is linear both in calibration mode and in data transmit mode.

Despite the aforementioned advances, no known prior art post-distortion methodologies are designed to correct the receive path nonlinearity, particularly during calibration. Many transmitters are positioned adjacent to a receiver, usually in the same single chip. The power amplifier broadcasts substantial power, sometimes more than 30 dBm (1 Watt) to a −100 dBm sensitive receiver, thereby compressing the receiver.
The predistorter cannot be calibrated if the receive chain is saturated while in calibration mode. If calibration is attempted while the receiver is in saturation, the result will be a substantial degradation of predistorter performance.

One attempt to solve this problem is to add a secondary receiver as a low sensitivity receiver that will not be compressed. However, this approach is costly and inefficient. Another popular approach is to shut down the power supply to the low noise amplifier (LNA) while in calibration mode, thus making it act as an attenuator. Nevertheless, the receiver still exhibits some nonlinearity due to saturation.

What is needed is a digital solution that compensates for RF front-end nonlinearities using predistortion and post-distortion to provide correction for both the receiver and the transmitter in a calibration mode and that obviates a secondary receiver. The invention is directed to overcoming one or more of the problems and solving one or more of the needs as set forth above.

SUMMARY OF THE INVENTION

As used herein, for convenience of reference, the term transceiver broadly refers to any device, unit or system that contains both a transmitter and a receiver. The transmitter and receiver may be combined, contained on a single integrated circuit chip, share other common circuitry, or contained in a single system.

To solve one or more of the problems set forth above, in an exemplary implementation of the invention, a post-distorter compensates for receiver nonlinearity in calibration mode. This linearized receiver-side output from the post-distorter is used to correctly compensate for transmitter-side nonlinearities in calibration mode. In addition to compensating for receiver-side nonlinearities during calibration mode, the post-distorter may compensate for receiver-side nonlinearities during normal receive mode. Thus, in such an embodiment, the post-distorter features dual modes of use, a calibration mode, wherein calibration signals received from the adjacent transmitter are linearized by the post-distorter and a normal receive mode, wherein communication signals from a remote transmitter are linearized by the post-distorter.

In one aspect of an exemplary implementation of the invention, a system for distortion compensation is embodied in a transceiver. The system includes a predistorter operably disposed between a digital transmitter and a power amplifier and a post-distorter operably disposed between a receiver amplifier and a digital receiver. The receiver amplifier is operably disposed between a low noise amplifier and an IQ mixer. The system is configurable to operate in a configuration mode with the transmitter and receiver active. The post-distorter is adapted to compensate for nonlinearities in the receiver amplifier and, in configuration mode, produce post-distorted in-phase and quadrature-phase output signals and communicate such signals to the predistorter. The predistorter is adapted to compensate for nonlinearities in the power amplifier. In calibration mode, cross talk radiation leaks into the low noise amplifier, receiver amplifier and IQ mixer.

In another aspect of an exemplary implementation of the invention, the post-distorter, in receive mode, produces post-distorted in-phase and quadrature-phase output signals and communicates such signals to the digital receiver.

In another aspect of an exemplary implementation of the invention, a method for linearizing output signals from an inherently non-linear transceiver device during calibration is provided. The method includes steps of amplifying signals received through an antenna from a transmitter of the transceiver, filtering the amplified signals using a low pass filter, converting the filtered signals to digital signals using an analog to digital converter, producing post-distorted in-phase and quadrature-phase output signals based upon the digital signals, communicating the post-distorted in-phase and quadrature-phase output signals to a predistorter, and linearizing output from the transmitter using the predistorter. Gain control of a power amplifier is decreased to 0 and then increased slowly until it reaches a determined back-off point. After reaching the back-off point, a receiver of the transceiver is activated, thereby, causing the receiver to be compressed due to cross talk and intermodulation distortion. Post-distorter system identification coefficients are then calculated for the receiver. The step of linearizing output from the transmitter using the predistorter entails applying the post-distorter system identification coefficients to the predistorter, and the method further including a step of increasing gain control until the increase causes an increase in error vector magnitude or a decrease in signal to noise ratio, and then decreasing gain control by a determined amount causing a decrease in the error vector magnitude or increase in signal to noise ratio. The system identification coefficients are saved in a memory.

BRIEF DESCRIPTION OF THE DRAWINGS

The foregoing and other aspects, objects, features and advantages of the invention will become better understood with reference to the following description, appended claims, and accompanying drawings, where:

Those skilled in the art will appreciate that the figures are not intended to be drawn to any particular scale; nor are the figures intended to illustrate every embodiment of the invention. The invention is not limited to the exemplary embodiments depicted in the figures or the types or arrangements of components shown in the figures.

DETAILED DESCRIPTION

A system and method according to principles of the invention offers several key improvements and advantages over the prior art. Most prior art compensation hardware and software erroneously assume that the receiver operates linearly during calibration. The assumption is based on the fact that the receiver tends to operate linearly during normal receive mode because signals received from a distance during normal receive mode are attenuated substantially by the time they are received and processed by the receiver. However, during calibration mode the receiver operates in the nonlinear region because the transmitter of a transceiver is adjacent to the receiver and the receiver receives full strength signals from the adjacent transmitter. If, as in the prior art, the transmitter is calibrated using uncorrected receiver signals, nonlinearities from the receiver will corrupt the calibration. To address this problem, an exemplary post-distorter in accordance with principles the present invention compensates for receiver nonlinearity in calibration mode. This linearized receiver-side output from the post-distorter is used to correctly compensate for transmitter-side nonlinearities in calibration mode.

In an exemplary embodiment of the present invention, the post-distorter provides an additional function. In addition to compensating for receiver-side nonlinearities during calibration mode, the post-distorter compensates for receiver-side nonlinearities during normal receive mode. Thus, in such an embodiment, the post-distorter features dual modes of use, a calibration mode, wherein calibration signals received from the adjacent transmitter are linearized by the post-distorter and a normal receive mode, wherein communication signals from a remote transmitter are linearized by the post-distorter.

Figure 1:
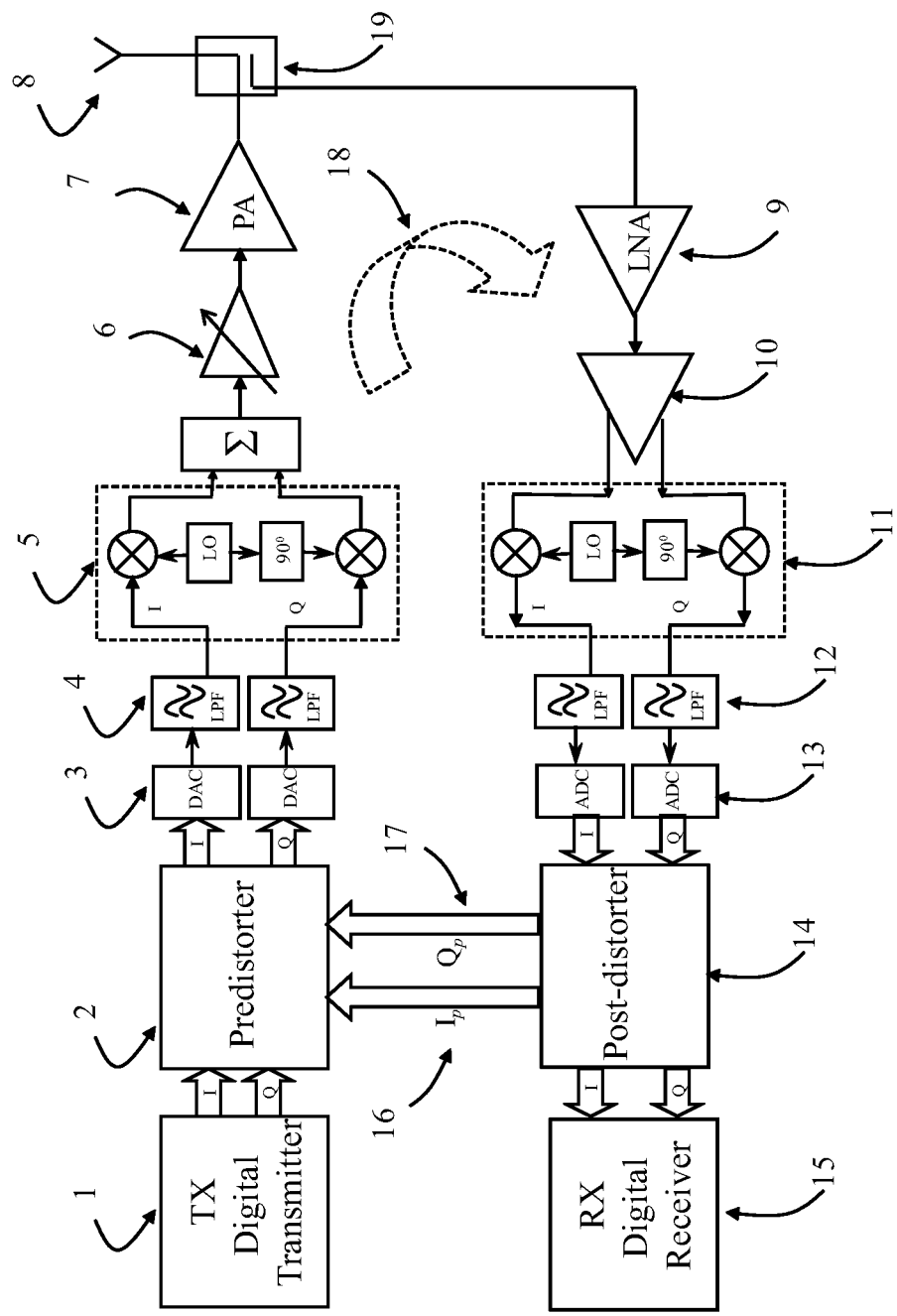
FIG. 1 shows an exemplary transceiver system configured to compensate for RF front-end nonlinearities using predistortion and post-distortion to provide correction for both the receiver and the transmitter in a calibration mode according to principles of the invention.

Referring now to the Figures, in which like parts are indicated with the same reference numerals, various views of exemplary digital predistortion and post-distortion system, which operates on the input signal to a non-linear power amplifier in order to linearize the transmitter amplifier, while pushing high power though the receiver amplifier rendering it non linear. With particular reference to FIG. 1, a digital transmitter 1 generates an in-phase (I) signal component and a quadrature-phase (Q) signal component. The transmitter 1 is connected to a digital predistorter 2. The predistorter 2 converts the in-phase and quadrature-phase input signals in order to pre-compensate for distortions possibly occurring in the power amplifier 7. The digital predistorter 2 calculates predistortion gains using polynomial coefficients obtained by modeling an inverse nonlinear distortion characteristic of the power amplifier 7, and stores the calculated predistortion gains in a look-up table. Digital to analog converters 3 convert the in-phase (I) and quadrature-phase (Q) input signals to analog signals. The analog signals are then filtered by a low pass filter 4. The output from the filters 4 is converted into a RF signal having a frequency band of the mobile communication system by the frequency up-converter 5. Specifically, the frequency up-converter 5 is implemented with an I-Q mixer for generating a desired frequency by mixing the signal with a transmission local oscillation signal LO generated by an oscillator using a reference clock from a phase locked loop. Output from the up-converter 5 with the I-Q mixer is communicated to a gain control unit 6 configured to boost its signal output. RF signal output from the gain control unit 6 is amplified by the non linear power amplifier 7. With the aid of an antenna 8, the amplifier 7 wirelessly communicates signals. Many of these components are typically found in conventional transmitters and the foregoing transmitter components are intended to represent a broad category of nonlinear RF transmitters.

On the receiving side, the system may use a coupler or a switch 19. In normal operation mode, the system may shut the transmitter off while receiving and shut the receiver off when transmitting, in order to avoid interference. However when calibrating the predistorter 2 in accordance with principles of the invention, both the transmitter and the receiver are active. In calibration mode, cross talk radiation and spurious signals, leak into the low noise amplifier 9 and the receive chain amplifier 10 as well as to the IQ mixer 11. The received signals filtered by the low pass filter 12 are then converted to digital signals using the analog to digital converters 13. The post-distorter 14 is active only while in calibrating mode and (optionally) in normal receive mode. In normal transmit mode, the post-distorter is not active. In normal receive mode, the post-distorter may optionally be active, but such activity is not essential due to the good linearity achieved for attenuated signals typically received during normal receive mode. The post-distorter produces post-distorted in-phase (I) and quadrature-phase (Q) output signals $I_p$ 16 and $Q_p$ 17 which are communicated to the predistorter 2. The post-distorter also produces normal in-phase (I) and quadrature-phase (Q) output signals I Q in normal receive mode for the digital receiver 15.

Components of the transceiver system may be implemented using digital circuitry, analog circuitry, software, firmware or any combination thereof. Thus, as used herein, a predistorter may be implemented as digital circuitry, analog circuitry, software, firmware or any combination thereof. Likewise, as used herein, a post-distorter may be implemented as digital circuitry, analog circuitry, software, firmware or any combination thereof.

Figure 2:
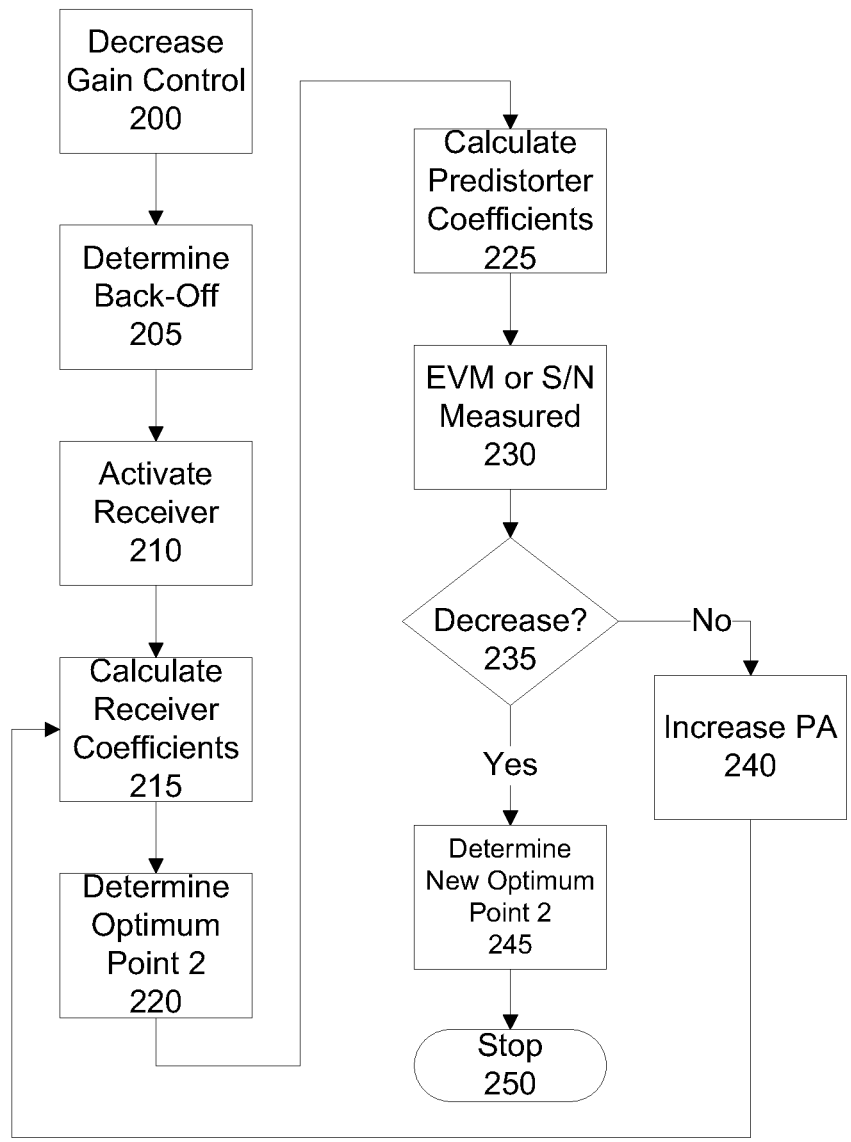
FIG. 2 shows an exemplary flowchart for a method of compensating for RF front-end nonlinearities using predistortion and post-distortion to provide correction for both the receiver and the transmitter in a calibration mode according to principles of the invention.

Referring now to FIG. 2, steps of an exemplary calibration method in accordance with principles of the invention may be performed as a pre-fabrication or factory calibration process. As an initial step, the gain control is decreased to 0, as in step 200. While the power amplifier 7 is still in the linear region, the gain control is then increased slowly, as in step 205, until it reaches a point at the edge of non-linearity, which is monitored using monitoring equipment such as an external S/N meter or EVM calculator tester. The edge of nonlinearity corresponds to the 1 dB compression point. This working point is referred to as the "back-off" point from the 1 dB compression point. At the "back-off" point the signal to noise (or EVM) is at (or about at) the desired point of optimum 1.

The error vector magnitude (EVM) is a measure of how far constellation points deviate from ideal locations. EVM measures the vector difference between measured and ideal signals. Signal-to-noise ratio (S/N) is a ratio of a signal power to the noise power corrupting the signal. The higher the ratio, the less obtrusive the noise.

After the back-off point is determined, the receiver is activated while the transmitter is at the optimum point 1, as in step 210. The receiver will be compressed due to cross talk and intermodulation distortion. At that point, the receiver is operating in the nonlinear region and creates a spectral re-growth.

Assuming that the power amplifier (PA) is in the linear region, the post-distorter system identification coefficients for the receiver are calculated, as in step 215, using a post-distorter building methodology, which is discussed more fully below.

Next, using gain control 6, the power is increased by one step (e.g., by a determined amount, such as 1 dB or a fraction of 1 dB), as in step 220. This point is referred to as optimum point 2.

At optimum point 2, the receiver should produce linear results upon applying the post-distortion using the post-distorter system identification coefficients for the receiver as calculated in step 215. The predistorter system identification coefficients are then calculated for the receiver using the predistorter building methodology, which is discussed more fully below, as in step 225.

Next, EVM or S/N is measured using either the digital receiver 15 or an external measuring device, such as an S/N meter or EVM calculator tester, as in step 230. If performance decreases (i.e., if the measured EVM or S/N decreases in comparison to the measurement in step 205), then using gain control 6, the power is of the power amplifier (PA) is increased by one step (e.g., by a determined amount, such as 1 dB or a fraction of 1 dB), as in step 240 and control is passed to step 215. Otherwise control is passed back to step 220.

In step 240, the new optimum point 2 is determined.

Advantageously, once the system identification coefficients have been calculated for a given power, they can be saved in memory and reused without the need to repeat the foregoing steps.

The principles of the invention are not limited to a particular post-distorter methodology. Any post-distorter (i.e., equalizer) that produces post-distorted in-phase (I) and quadrature-phase (Q) output signals, $I_p$ 16 and $Q_p$ 17, which are communicated to the predistorter 2 during calibration and also produces normal in-phase (I) and quadrature-phase (Q) output signals I Q in normal receive mode for the digital receiver 15 may be utilized. By way of example and not limitation, a digital predistorter may be built as follows:

$$Z_n = Y^*/Y^{n-1} \, n=1,3,5 \ldots$$

Where:
$Z_n$ is a temporary buffer, and
Y is a buffer of AD digital samples.

Functions (i.e., temporary buffers) are built with the following properties:

$$V_1 = Z_1$$

$$V_3 = Z_3 - \alpha_{3\_1} * Z_1$$

$$V_5 = Z_5 - \alpha_{5\_3} * Z_3 - \alpha_{5\_1} * Z_1$$

A least mean squares (LMS) algorithm is used to find filter coefficients that produce the least mean squares of an error signal (i.e., the difference between the desired and the actual signal). Using an LMS algorithm, a set of filter coefficients, a, are determined such that temporary buffers, $V_1$, $V_2$, and $V_3$, are orthogonal (or almost orthogonal). The output of the post-distorter P(t) is constructed using the following LMS algorithm:

$$P(t) = \sum_{n=-k \ldots k} V_1(t+n) * H_1(n) + \sum_{n=-k \ldots k} V_3(t+n) * H_3(n) + \sum_{n=-k \ldots k} V_5(t+n) * H_5(n) + \ldots$$

The principles of the invention are also not limited to a particular predistorter methodology. Any predistorter that inversely models the amplifier's gain and phase characteristics based upon post-distorted in-phase (I) and quadrature-phase (Q) output signals, $I_p$ 16 and $Q_p$ 17, and, when combined with the amplifier, produces an overall system that is more linear and reduces the amplifier's distortion. By way of example and not limitation, a digital predistorter may be constructed as follows:

$$Z_n = Y^*/Y^{n-1} \, n=1,3,5 \ldots$$

Where:
$Z_n$ is a temporary buffer.

Y is the buffer of the Post-distorter digital samples.
Temporary buffers may be constructed with the following properties $$V_1 = Z_1$$

$$V_3 = Z_3 - \alpha_{3\_1} * Z_1$$

$$V_5 = Z_5 - \alpha_{5\_3} * Z_3 - \alpha_{5\_1} * Z_1$$

Using an LMS algorithm, a set of filter coefficients, α, are determined such that temporary buffers, $V_1$, $V_2$, and $V_3$, are orthogonal (or almost orthogonal).

Then, the output P(t) of a second post-distorter (not to be confused with the post-distorter described above) is constructed using the following LMS algorithm:

$$P(t) = \sum_{n=-k \ldots k} V_1(t+n) * H_1(n) + \sum_{n=-k \ldots k} V_3(t+n) * H_3(n) + \sum_{n=-k \ldots k} V_5(t+n) * H_5(n) + \ldots$$

Next, another temporary buffer is constructed $$Z_n = Y^*/Y^{n-1} \, n=1,3,5 \ldots$$

Where:
$Z_n$ is a temporary buffer.
X is the buffer of the second post-distorter digital samples.
Temporary buffers may be constructed with the following properties $$V_1 = Z_1$$

$$V_3 = Z_3 - \alpha_{3\_1} * Z_1$$

$$V_5 = Z_5 - \alpha_{5\_3} * Z_3 - \alpha_{5\_1} * Z_1$$

Using functions H from the second post-distorter, output P(t) of a predistorter is constructed using the following LMS algorithm:

$$P(t) = \sum_{n=-k \ldots k} V_1(t+n) * H_1(n) + \sum_{n=-k \ldots k} V_3(t+n) * H_3(n) + \sum_{n=-k \ldots k} V_5(t+n) * H_5(n) + \ldots$$

Using the LMS algorithm, a lookup table is constructed:

$$X(n)*k(M(n),M(n-1),\phi(n,n-1)=P(n)$$

where:
M=Magnitude
$\phi(n,n-1))$=phase difference

The invention, including the exemplary embodiments described above, offers several key improvements and advantages over the prior art. Most prior art compensation hardware and software erroneously assume that the receiver operates linearly during calibration. The assumption is based on the fact that the receiver tends to operate linearly during normal receive mode because signals received from a distance during normal receive mode are attenuated substantially by the time they are received and processed by the receiver. However, during calibration mode the receiver operates in the nonlinear region because the transmitter is adjacent to the receiver and the receiver receives full strength signals from the adjacent transmitter. If, as in the prior art, the transmitter is calibrated using uncorrected receiver signals, nonlinearities from the receiver will corrupt the calibration. To address this problem, an exemplary post-distorter in accordance with principles the present invention compensates for receiver nonlinearity in calibration mode. This linearized receiver-side output from the post-distorter is used to correctly compensate for transmitter-side nonlinearities in calibration mode.

In an exemplary embodiment of the present invention, the post-distorter provides an additional function. In addition to compensating for receiver-side nonlinearities during calibration mode, the post-distorter compensates for receiver-side nonlinearities during normal receive mode. Thus, in such an embodiment, the post-distorter features dual modes of use, a calibration mode, wherein calibration signals received from the adjacent transmitter are linearized by the post-distorter and a normal receive mode, wherein communication signals from a remote transmitter are linearized by the post-distorter.

While an exemplary embodiment of the invention has been described, it should be apparent that modifications and variations thereto are possible, all of which fall within the true spirit and scope of the invention. With respect to the above description then, it is to be realized that the optimum relationships for the components and steps of the invention, including variations in order, form, content, function and manner of operation, are deemed readily apparent and obvious to one skilled in the art, and all equivalent relationships to those illustrated in the drawings and described in the specification are intended to be encompassed by the present invention. The above description and drawings are illustrative of modifications that can be made without departing from the present invention, the scope of which is to be limited only by the following claims. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents are intended to fall within the scope of the invention as claimed.

What is claimed is:

1. A system for distortion compensation embodied in a transceiver, said system comprising
   a predistorter operably disposed between a digital transmitter and a power amplifier;
   a post-distorter operably disposed between a receiver amplifier and a digital receiver;
   said system being configurable to operate in a configuration mode with said transmitter and receiver active; and
   said post-distorter adapted to compensate for nonlinearities in the receiver amplifier and, in configuration mode, produce post-distorted in-phase and quadrature-phase output signals and communicate such signals to the predistorter by filtering amplified signals from the receiver amplifier using a low pass filter, converting the filtered signals to digital signals using an analog to digital converter, producing the post-distorted in-phase and quadrature-phase output signals based upon the digital signals, and communicating the post-distorted in-phase and quadrature-phase output signals to the predistorter; and
   said predistorter adapted to compensate for nonlinearities in the power amplifier by linearizing output from the digital transmitter.

2. The system for distortion compensation embodied in the transceiver according to claim 1, said system further being configurable to operate in a receive mode, and
   said post-distorter, in receive mode, producing the post-distorted in-phase and quadrature-phase output signals and communicating such signals to the digital receiver.

3. The system for distortion compensation embodied in the transceiver according to claim 1, said system further being configurable to operate in configuration mode and in a receive mode, and
   said post-distorter, in receive mode, producing the post-distorted in-phase and quadrature-phase output signals and communicating such signals to the digital receiver.

4. The system for distortion compensation embodied in the transceiver according to claim 1, said system post-distorter being configured to operate only in configuration mode.

5. The system for distortion compensation embodied in the transceiver according to claim 1, said system further comprising a low noise amplifier operably coupled to said receiver amplifier.

6. The system for distortion compensation embodied in the transceiver according to claim 1, said system further comprising a low noise amplifier operably coupled to said receiver amplifier and an IQ mixer operably coupled to said receiver amplifier, said receiver amplifier being disposed between said low noise amplifier and said IQ mixer.

7. The system for distortion compensation embodied in the transceiver according to claim 1, said system further comprising a low noise amplifier operably coupled to said receiver amplifier and an IQ mixer operably coupled to said receiver amplifier, said receiver amplifier being disposed between said low noise amplifier and said IQ mixer and, in calibration mode, cross talk radiation leaking into the low noise amplifier, receiver amplifier and IQ mixer.

8. The system for distortion compensation embodied in the transceiver according to claim 1, said system further comprising an IQ mixer operably coupled to said receiver amplifier, said IQ mixer being disposed between said receiver amplifier and said post-distorter and, in calibration mode, cross talk radiation leaking into the low noise receiver amplifier and IQ mixer.

9. The system for distortion compensation embodied in the transceiver according to claim 1, said system further comprising an IQ mixer operably coupled to said receiver amplifier, said IQ mixer being disposed between said receiver amplifier and said post-distorter and, in calibration mode, cross talk radiation leaking into a low noise receiver amplifier and IQ mixer, and a gain control unit operably coupled to said power amplifier.

10. The system for distortion compensation embodied in the transceiver according to claim 1, said system further comprising an IQ mixer operably coupled to said receiver amplifier, said IQ mixer being disposed between said receiver amplifier and said post-distorter and, in calibration mode, cross talk radiation leaking into a low noise receiver amplifier and IQ mixer, and a gain control unit operably coupled to said power amplifier, and a frequency up converter operably coupled to said gain control unit.

11. The system for distortion compensation embodied in the transceiver according to claim 1, said system further being configurable to operate in configuration mode and in a receive mode, and
   said post-distorter, in receive mode, producing the post-distorted in-phase and quadrature-phase output signals and communicating such signals to the digital receiver.

12. The system for distortion compensation embodied in the transceiver according to claim 1, said system post-distorter means being configured to operate only in said configuration mode.

13. A system for distortion compensation embodied in a transceiver, said system comprising
   a predistorter operably disposed between a digital transmitter and a power amplifier;
   a post-distorter operably disposed between a receiver amplifier and a digital receiver;
   said system being configurable to operate in a configuration mode with said transmitter and receiver active; and
   said post-distorter adapted to compensate for nonlinearities in the receiver amplifier and, in configuration mode, produce post-distorted in-phase and quadrature-phase output signals and communicate such signals to the predistorter, and said predistorter adapted to compensate for nonlinearities in the power amplifier.

14. The system for distortion compensation embodied in the transceiver according to claim 13, said system further being configurable to operate in a receive mode, and
   said post-distorter, in receive mode, producing post-distorted in-phase and quadrature-phase output signals and communicating such signals to the digital receiver.

* * * * *